US008053360B2

(12) United States Patent
Yamazaki

(10) Patent No.: US 8,053,360 B2
(45) Date of Patent: Nov. 8, 2011

(54) SEMICONDUCTOR DEVICE AND METHOD OF MANUFACTURING THE SAME

(75) Inventor: Kazuo Yamazaki, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 87 days.

(21) Appl. No.: 12/356,844

(22) Filed: Jan. 21, 2009

(65) Prior Publication Data

US 2009/0184353 A1    Jul. 23, 2009

(30) Foreign Application Priority Data

Jan. 22, 2008 (JP) ................. 2008-011532

(51) Int. Cl.
*H01L 21/4763* (2006.01)

(52) U.S. Cl. . 438/639; 438/666; 438/675; 257/E21.584; 257/E21.585; 257/E21.657; 257/E21.658

(58) Field of Classification Search ........... 257/E21.495, 257/E21.658, E21.657, E27.088, E21.584, 257/E21.585; 438/629, 639, 696, 597, 666, 438/653, 675, 622, 623, 667

See application file for complete search history.

(56) References Cited

U.S. PATENT DOCUMENTS

| | | | | |
|---|---|---|---|---|
| 5,714,804 A * | 2/1998 | Miller et al. | ................ | 257/763 |
| 6,187,672 B1 * | 2/2001 | Zhao et al. | ................ | 438/639 |
| 6,251,790 B1 * | 6/2001 | Jeong | ................ | 438/697 |
| 6,884,715 B1 * | 4/2005 | Kwon et al. | ................ | 438/638 |
| 7,361,591 B2 * | 4/2008 | Park | ................ | 438/652 |
| 7,728,375 B2 * | 6/2010 | Shin et al. | ................ | 257/306 |
| 2002/0146899 A1 * | 10/2002 | Chun | ................ | 438/618 |
| 2003/0214022 A1 * | 11/2003 | Yang et al. | ................ | 257/678 |
| 2007/0224758 A1 * | 9/2007 | Park | ................ | 438/253 |
| 2008/0003866 A1 * | 1/2008 | Bae et al. | ................ | 439/417 |
| 2009/0032954 A1 * | 2/2009 | Kim | ................ | 257/754 |
| 2009/0085083 A1 * | 4/2009 | Shin | ................ | 257/297 |
| 2009/0321931 A1 * | 12/2009 | Lee et al. | ................ | 257/741 |
| 2010/0210087 A1 * | 8/2010 | Sung et al. | ................ | 438/381 |

FOREIGN PATENT DOCUMENTS

| | | |
|---|---|---|
| JP | 2000-299437 A | 10/2000 |
| JP | 2002-231906 A | 8/2002 |
| JP | 2003-7854 A | 1/2003 |
| JP | 2005-039189 A | 2/2005 |

\* cited by examiner

*Primary Examiner* — Matthew Landau
*Assistant Examiner* — Latanya N Crawford
(74) *Attorney, Agent, or Firm* — Sughrue Mion, PLLC

(57) ABSTRACT

To prevent two contacts that have different heights, share at least one interlayer insulating film and are disposed close to each other from being short-circuited to each other due to misalignment thereof, a semiconductor device according to the invention has a recess in an interlayer insulating film in which a first contact hiving a lower height, the recess being formed by the upper surface of the first contact, and a silicon nitride sidewall is formed in the recess to extend from the upper surface of the first contact and along the side surface of the recess.

16 Claims, 6 Drawing Sheets

PRIOR ART

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same. In particular, it relates to a structure of a device, such as a memory cell, that includes a capacitor contact and a bit contact disposed close to each other in which a short circuit between the contacts is prevented, and a method of manufacturing the same.

2. Related Art

Memory cells used in semiconductor devices, such as DRAM, include a memory cell transistor and a capacitor. As a memory device with high integration density, a Capacitor Over Bit-line (COB) type DRAM has been proposed in which capacitors are disposed in a layer above bit lines.

FIG. 11 is a cross-sectional view of a part of such a COB-type DRAM. Bit contact 12 and capacitor contact 13 are connected to respective cell contacts 11 connected to cell transistors (not shown), and bit line 14 is disposed on bit contact 12. Capacitor contact 13 extends into an upper insulating layer that covers bit line 14 and is connected to a capacitor that includes lower electrode 15, capacitor dielectric film 16 and upper electrode 17.

To prevent a short circuit between a bit line and a capacitor contact, there has been proposed a method of forming a nitride sidewall on the side of the bit line in a self-alignment manner (see Japanese Patent Laid-Open Nos. 2002-231906 and 2003-7854). Alternatively, in Japanese Patent Laid-Open No. 2005-39189, there is proposed a method of preventing a short circuit between a bit line and a capacitor contact by covering both the bit line and the bit contact with a direct nitride film.

On the other hand, based on a different idea, there has been proposed a structure in which a nitride film surrounding an upper part of a bit contact is formed, which is manufactured by partially forming a contact hole for a bit contact, forming a sidewall nitride film on the inner surface of the partially formed contact hole, using the sidewall nitride film as a mask to complete the contact hole having a reduced diameter that extends to the lower structure, filling the contact hole with a conductive material, and planarizing the conductive material by CMP or the like to form the bit contact (Japanese Patent Laid-Open No. 2000-299437).

With the advance of miniaturization of the semiconductor device, the problem of a short circuit between a bit line and a capacitor contact is becoming more serious, and the short-circuit margin between the capacitor contact and the bit contact is decreasing. However, from the viewpoint of ensuring adequate electrical connection, it is not wise to reduce the diameter of the contacts. In addition, considering that alignment is performed on the upper layer, the contacts preferably have larger diameters in upper parts than in lower parts.

Thus, if misalignment of a capacitor contact occurs, the top part of the bit contact, which has the largest diameter, and the capacitor contact are short-circuited. As shown in FIG. 12(a), the top part of bit contact 22 and capacitor contact 23 are in contact with each other and thus short-circuited. FIG. 12(b) is a top view, in which reference numeral 24 denotes a bit line, reference numeral 25 denotes the top surface of bit contact 22, and reference numeral 26 denotes the top surface of capacitor contact 23. FIG. 12(a) is a cross-sectional view taken along the line A-A in FIG. 12(b), in which reference numeral 21 denotes a cell contact. In FIG. 12(a), illustration of the bit line, a capacitor and a cell transistor is omitted.

As disclosed in Japanese Patent Laid-Open No. 2005-39189, a short circuit can be prevented by covering both the bit line and the bit contact with a nitride film. However, to cover the bit contact with a nitride film, the interlayer insulating film covering the bit contact has to be previously removed. Furthermore, in the case of a contact that has a larger diameter in an upper part thereof as shown in FIGS. 12(a) and 12(b), the contact covered with a nitride film is increased in diameter in a lower part thereof, so that there is a possibility that the upper surface of the cell contact in the lower layer that is to be connected to the capacitor contact is partially covered in such a miniaturized structure, and the contact resistance of the capacitor contact increases.

Thus, there is a demand for a structure of a semiconductor device having a miniaturized cell structure or the like in which a short circuit between two contacts that have different heights and are disposed close to each other, such as a bit contact and a capacitor contact, due to a misalignment thereof is prevented without increasing the contact resistance of the capacitor contact.

SUMMARY

The present invention seeks to solve one or more of the above problems, or to improve upon those problems at least in part.

In one embodiment, there is provided a semiconductor memory device that includes at least a first contact and a second contact having a larger height than the first contact that share at least one interlayer insulating film and are disposed close to each other, wherein the upper surface of the first contact is lowered from the upper surface of an interlayer insulating film, in which the first contact is formed, to form a recess, and a silicon nitride sidewall extends in the recess from the upper surface of the first contact and along the side surface of the recess.

In another exemplary embodiment, there is provided a method of manufacturing a semiconductor device that includes at least a first contact and a second contact having a larger height than the first contact that share at least one interlayer insulating film and are disposed close to each other, comprising:

etching back the upper surface of the first contact to form a recess in an interlayer insulating film in which the first contact is formed; and forming a silicon nitride film in the recess and etching back the silicon nitride film to form a sidewall that extends from the upper surface of the first contact and along the side surface of the recess.

According to the these embodiments, even if the capacitor contact is formed close to an upper edge of the bit contact, the silicon nitride film blocks etching, so that a short circuit between the capacitor contact and the bit contact is prevented.

BRIEF DESCRIPTION OF THE DRAWINGS

The above features and advantages of the present invention will be more apparent from the following description of certain preferred embodiments taken in conjunction with the accompanying drawings, in which

FIG. 12(*b*) is a schematic plan view showing the situation.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

Figure 1:
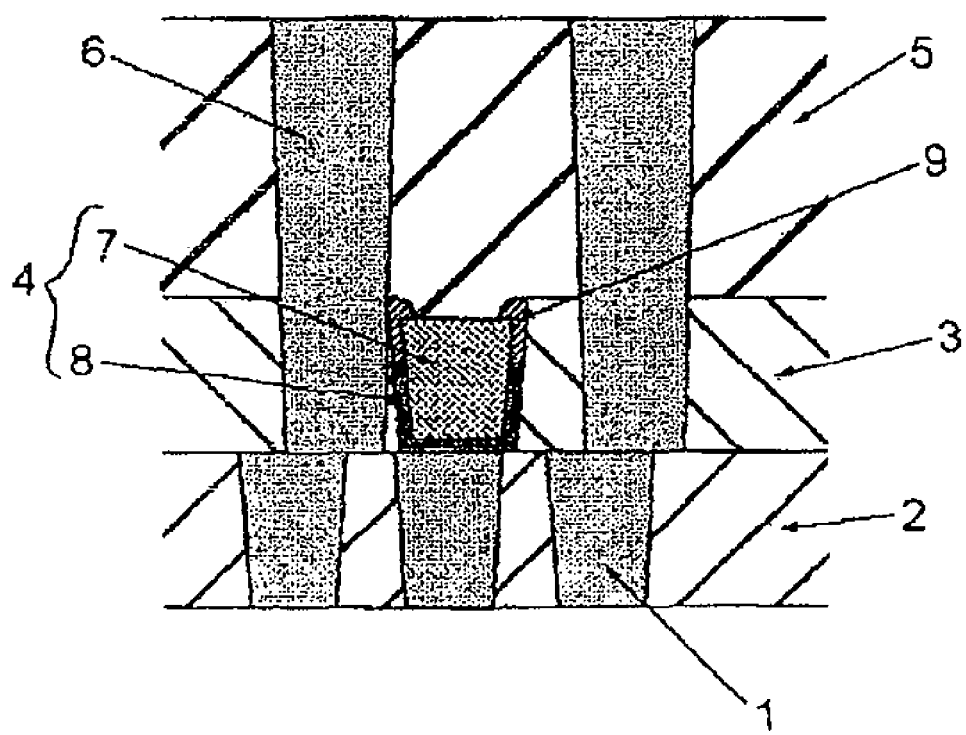
FIG. 1 is a schematic cross-sectional view of an apparatus that prevents a short circuit between a capacitor contact and a bit contact according to an exemplary embodiment.

A semiconductor device according to an exemplary embodiment is a semiconductor memory device, such as DRAM, shown in FIG. 1 and in a cell transistor part, bit contact 4 and capacitor contact 6 are adjacent to each other, a recess above bit contact 4 is formed in interlayer insulating film 3 in which bit contact 4 is formed, and silicon nitride sidewall 9 covering the side surface of the recess extends from the upper surface of bit contact 4. This drawing shows an example in which bit contact 4 comprises barrier film 8 and bit metal film 7. Reference numeral 1 denotes a cell contact to a cell transistor formed in a lower layer (not shown), reference numerals 2, 3 and 5 denote an interlayer insulating film. In this exemplary embodiment, bit contact 4 serves as the first contact, and capacitor contact serves as the second contact. Bit contact 4 and capacitor contact 6 share interlayer insulating film 3. Illustration of a bit line is omitted.

As shown in this drawing, since silicon nitride sidewall 9 is formed on the upper part;of the edge surface of bit contact 4, even in a case where an edge of bit contact 4 would otherwise be etched in formation of the capacitor contact, silicon nitride sidewall 9 functions as an etching stopper, so that bit contact 4 is prevented from being exposed. As a result, a short circuit between bit contact 4 and capacitor contact 6 is prevented.

Next, exemplary embodiments will be described.

First Exemplary Embodiment

According to a first exemplary embodiment, after a bit contact hole is formed, a TiN/Ti barrier film and a W film are buried in the bit contact hole, and then the TiN/Ti barrier film and the W film are polished by CMP, thereby forming a bit contact. Then, the bit contact is etched back by dry etching to form a recess structure in which the upper surface of the bit contact is recessed. In this process, the TiN/Ti barrier film surrounding the W plug is selectively etched so that the level of upper surface of the TiN/Ti barrier film is lower than that of the W plug. Then, a silicon nitride film is formed over the entire surface and then etched back so that a silicon nitride sidewall extending from the upper surface of the bit contact and covering the side surface of the recess structure is formed.

In the following, a manufacturing method according to the first exemplary embodiment will be described with reference to FIGS. 2 to 9.

Figure 2:
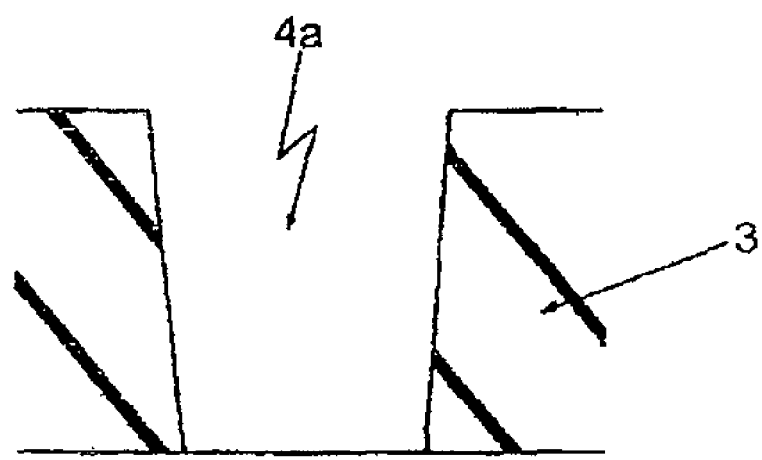
FIGS. 2 to 9 are schematic cross-sectional views showing different steps in a method of manufacturing a semiconductor device according to an exemplary embodiment.

First, to form a bit contact, interlayer insulating film (silicon oxide film) 3 is etched to form contact hole 4a that exposes to the upper surface of a base cell contact (not shown) (FIG. 2).

Figure 3:
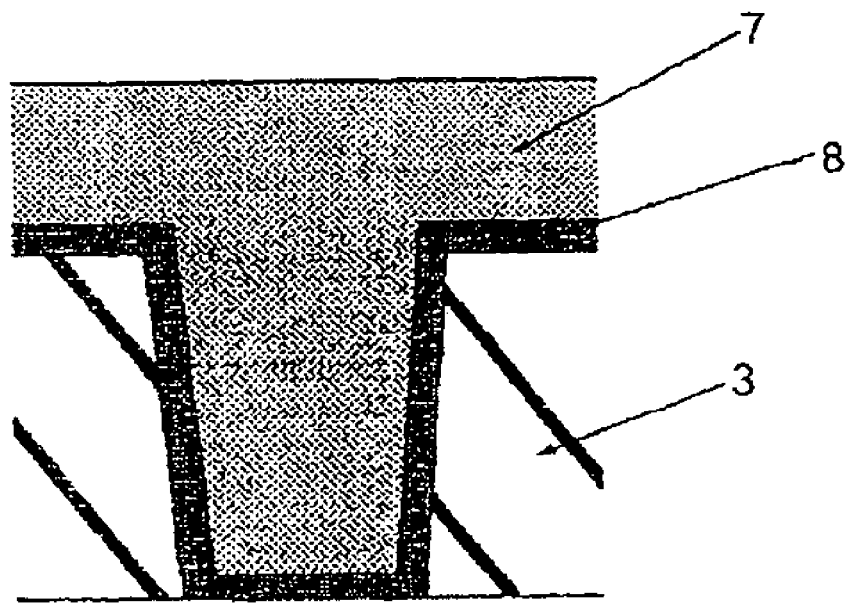

Then, a TiN film and a Ti film serving as barrier film 8 are formed. The Ti film is deposited by chemical vapor deposition (CVD) using $TiCl_4$, and the TiN film is deposited by CVD using $TiCl_4$ and $NH_3$. Then, tungsten (W) film 7 is formed. W film 7 is deposited by CVD using $WF_6$ and $H_2$ (FIG. 3).

Figure 4:
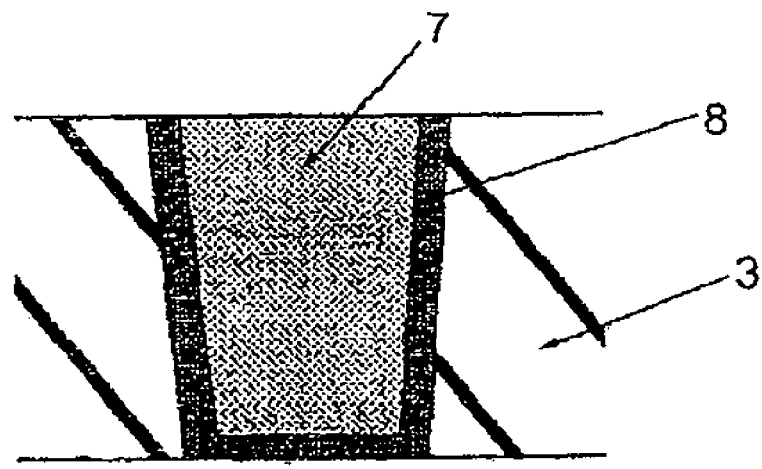
Figure 5:
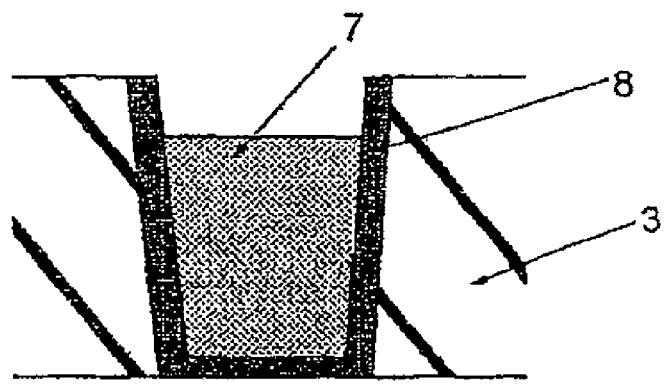

Then, CMP is performed to planarize the surface to form a plug (FIG. 4). At this point in time, the upper surface of the plug is flush with the upper surface of interlayer insulating film 3. Thus, then, the level of the upper surface of W film 7 and TiN/Ti barrier film 8 is lowered. W film 7 and TiN/Ti barrier film 8 are etched back by dry etching to form a recess. W film 7 is etched using a fluorine-based gas, and TiN/Ti barrier film 8 is etched using a chlorine-based gas. Since W film 7 is not substantially etched by the chlorine-based gas, and TiN/Ti barrier film 8 is not substantially etched by the fluorine-based gas, W film 7 and TiN/Ti barrier film 8 can be independently and selectively etched with high controllability. For example, etching of W film 7 involves an electron cyclotron resonance (ECR) etcher, $CF_4/O_2/N_2$ as a process gas, a pressure of 1.33 Pa (10 mTorr), a microwave power of 800 W and an RF power of 30 W. To lower the upper surface of the W plug by 40 nm, supposing that the etching rate for W is 100 nm/min, the etching can be performed for about 25 seconds. However, the fluorine-based gas can also etch interlayer insulating film 3, which is a silicon oxide film, and therefore, the etching conditions are preferably adjusted to increase the selectivity to the oxide film by decreasing the RF power, for example (FIG. 5).

Figure 6:
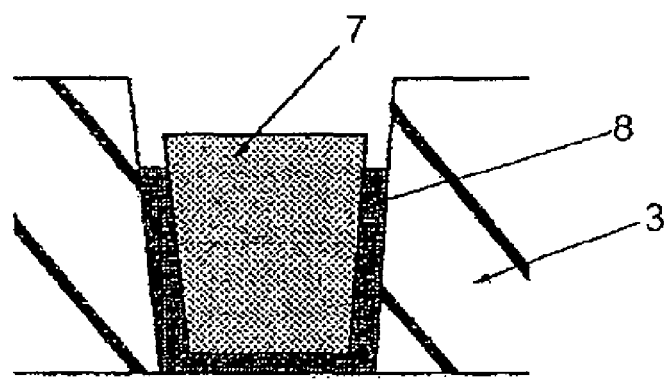

On the other hand, for example, etching of the TiN/Ti barrier film involves the ECR etcher, $BCl_3/Cl_2$ as a process gas, a pressure of 1.33 Pa (10 mTorr), a microwave power of 800 W and an RF power of 30 W. To lower the upper surface of the TiN/Ti barrier film by 80 nm, supposing that the etching rate for TiN/Ti is 100 nm/min, the etching can be performed for about 50 seconds. The chlorine-based gas can hardly etch interlayer insulating film 3, and therefore, a high selectivity to the oxide film can be achieved. In addition, the W film is also unlikely to be etched (FIG. 6).

Figure 7:
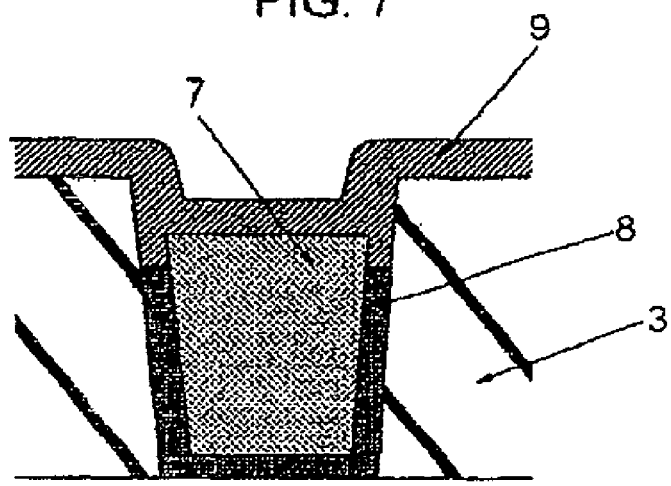
Figure 8:
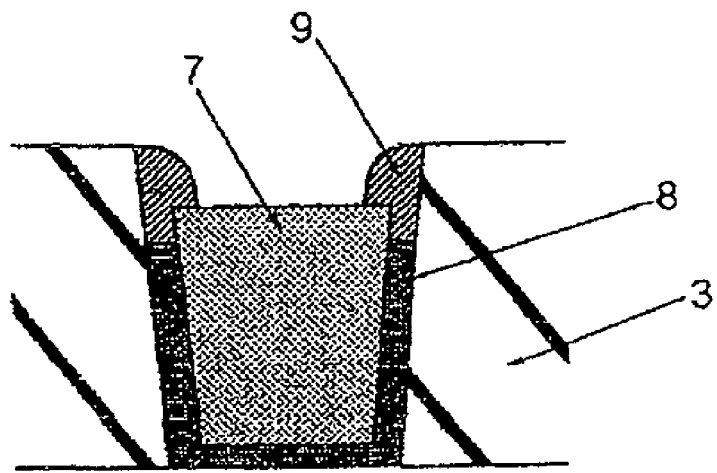

Then, silicon nitride film 9 is formed by CVD (FIG. 7). The thickness of silicon nitride film 9 is the lateral length of the sidewall to be formed later. For example, silicon nitride film 9 is formed to a thickness of 40 nm, for example, using $SiH_2Cl_2$ as a process gas, under a pressure of 133 Pa (1 Torr) and at a temperature of 680° C.

Then, the silicon nitride film is etched back to form a sidewall. The etch back of the silicon nitride film is dry etching and involves a parallel plate type etcher, $CF_4/CHF_3/Ar/O_2$ as a process gas, a pressure of 40 mTorr and an RF power of 250 W, for example. Although the etching of the W film and the TiN/Ti barrier film described above is half etching, so that end point detection is impossible, the end point of the etching of the silicon nitride film can be detected using plasma emission. Typically, the end point detection of the etching is performed by detecting light emission of SiF (at 440 nm). In this way, a sidewall extending along the sidewall of the bit contact and the upper edge of the contact can be formed.

Figure 9:
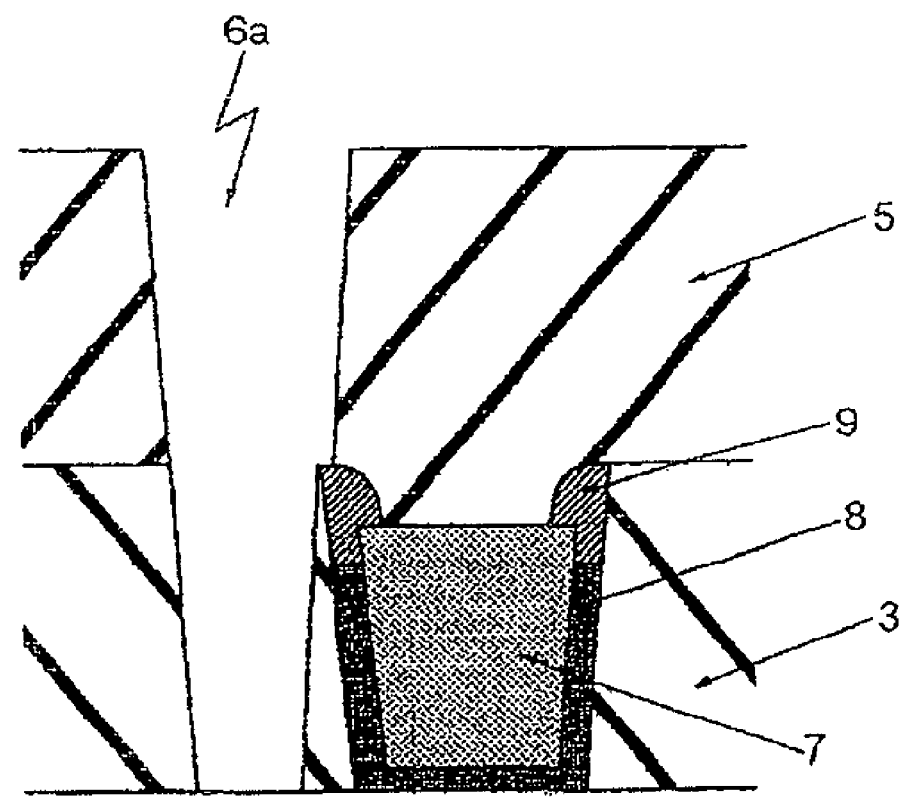

Then, a bit line is formed (not shown), interlayer insulating film (silicon oxide film) 5 is formed, and capacitor contact hole 6a is formed in interlayer insulating film 5. Even in a case where patterning of the capacitor contact involves a significant misalignment, an edge of the bit contact would otherwise be etched in etching to form the capacitor contact hole, the sidewall silicon nitride film 9 blocks the etching (etching of the oxide film to form the capacitor contact hole is performed under etching conditions including a high selectivity to the silicon nitride film), and therefore, a short circuit between the capacitor contact and the bit contact is prevented (FIG. 9).

Since the silicon nitride sidewall is formed along the sidewall and upper edge of the bit contact in this way, even if the capacitor contact is disposed close to an upper edge of the bit contact due to a misalignment in formation of the capacitor contact, the silicon nitride film blocks etching, so that a short circuit between the capacitor contact and the bit contact is prevented.

Consider a case where the W plug is etched back by 40 nm, and the silicon nitride film to form the sidewall is deposited to a thickness of 40 nm. Supposing that the depth of the bit contact is 180 nm, the amount of over etching of the capacitor contact is 50 nm, and the etching rate ratio between the oxide film and the silicon nitride film is 10, the thickness of the removed silicon nitride film is 23 nm. Since the initial height of the silicon nitride film sidewall is 40 nm, the thickness of the remaining silicon nitride film is 17 nm, and thus, a short circuit is prevented.

Since the silicon nitride sidewall is formed by etching back the TiN/Ti barrier film on the sidewall of the bit contact, no short circuit to the capacitor contact occurs also on the side surface of the bit contact. For example, in a case where the TiN film has a thickness of 15 nm, and the Ti film has a thickness of 10 nm, the silicon nitride film formed on the side surface of the bit contact has a thickness of 25 nm, which is a sufficient short-circuit margin.

If the W plug is excessively etched back, the bit line formed later experiences a large difference in height at the bit contact and thus can be broken at that part. Thus, the W plug is preferably etched back by an amount of about 30 to 60 nm. Furthermore, if the TiN/Ti barrier film is etched back to the bottom of the bit contact, an abnormal shape can occur. Thus, taking the controllability into account, the TiN/Ti barrier film is preferably etched back by an amount of about 30 nm to a half of the depth of the bit contact.

Second Exemplary Embodiment

In the exemplary embodiment described above, the W plug is formed by CMP. In the following, a method of etching back the W plug by dry etching, rather than using CMP, will be described.

Figure 10:
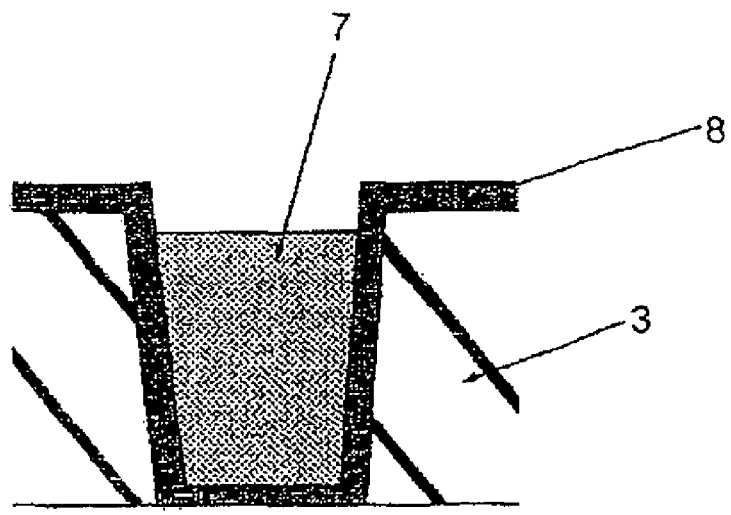
FIG. 10 is a schematic cross-sectional view showing a step in a method of manufacturing a semiconductor device according to another exemplary embodiment.
Figure 11:
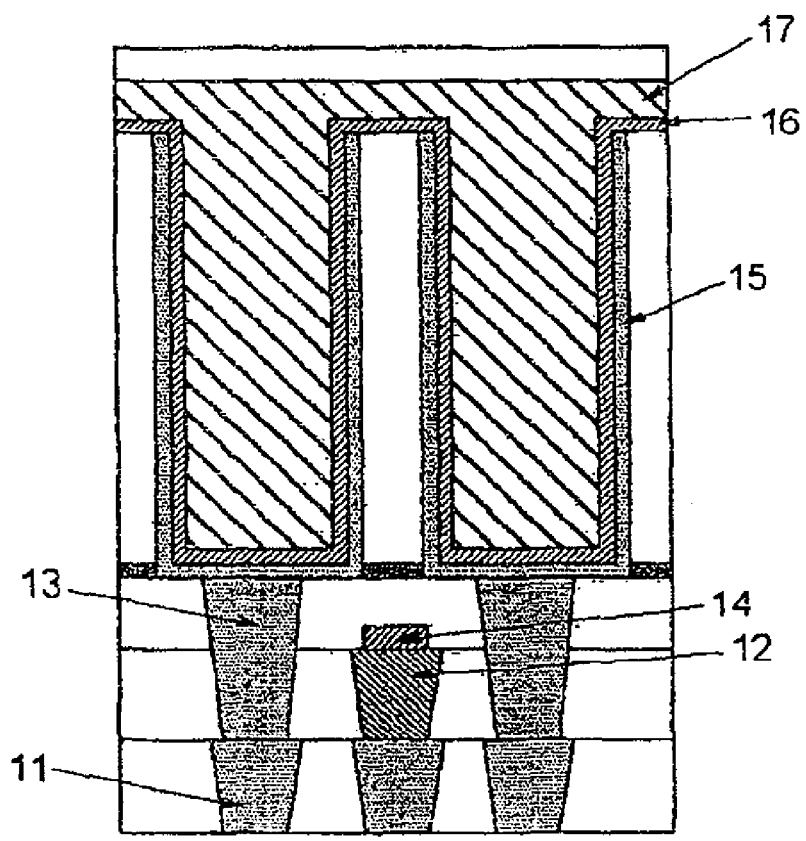
FIG. 11 is a schematic cross-sectional view of a semiconductor memory device having a typical COB structure.
Figure 12A:
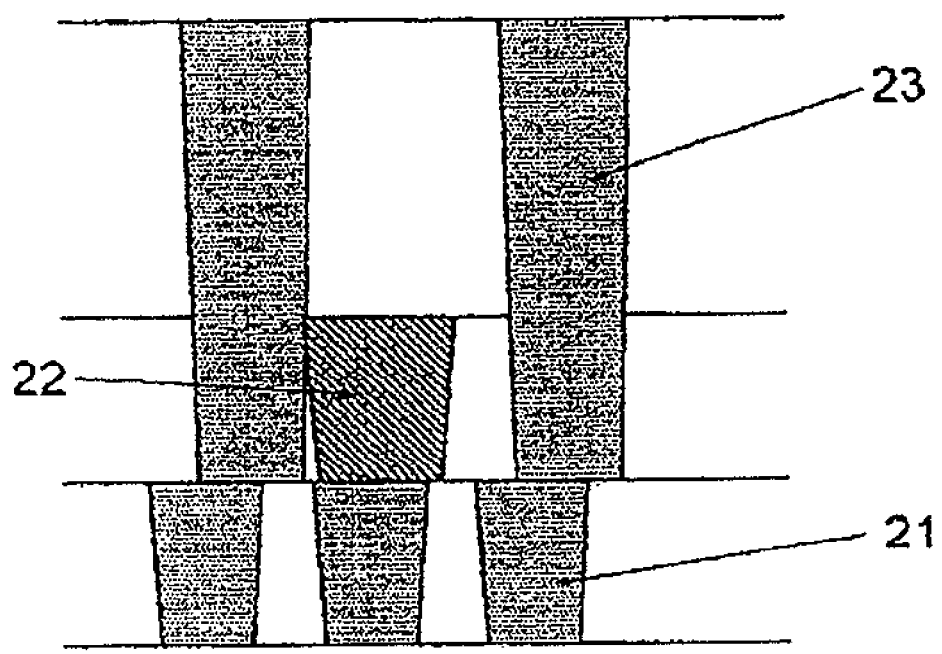
FIG. 12(*a*) is a schematic cross-sectional view for illustrating a situation in which a capacitor contact and a bit contact are short-circuited.
Figure 12B:
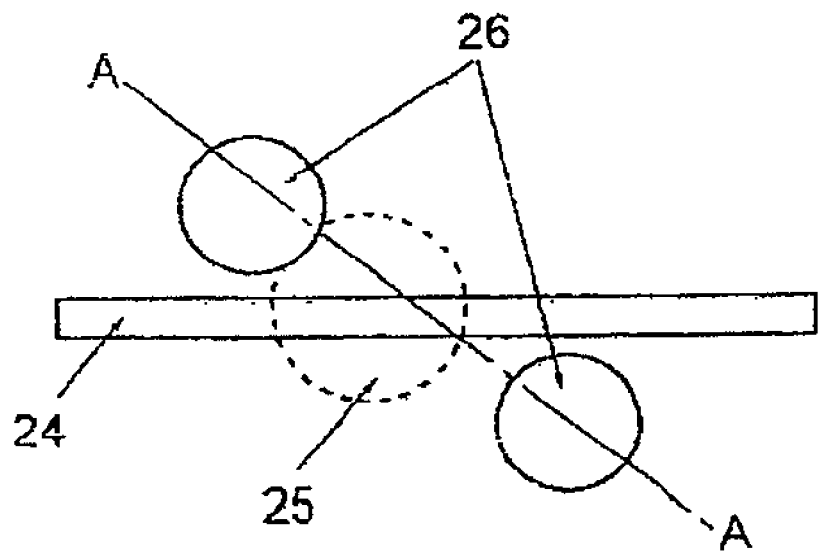

First, after barrier film 8 and W film 7 are buried in the bit contact hole as shown in FIG. 3, W film 7 is etched back under the same conditions as described above. In this process, based on the emission spectrum, the end point of the etching can be detected when TiN/Ti barrier film 8 is exposed on flat interlayer insulating film 3 at a part other than the part in which the bit contact is to be formed. Furthermore, over etching is performed to lower the upper surface of the W plug to a desired level (FIG. 10). Since the TiN/Ti barrier film is not substantially etched under the etching conditions for the W film, the TiN/Ti barrier film is then etched (under the same etching conditions as described in the first exemplary embodiment). Since the oxide film and the W film are not substantially etched under the etching conditions for the TiN/Ti barrier film, the TiN/Ti can be etched with high shape controllability. As a result, a structure in which barrier film 8 is retracted as shown in FIG. 6 is formed. Then, a sidewall can be formed in the same manner as described above.

Prevention of a short circuit between a capacitor contact and a bit contact has been described as an example. However, the present invention can be applied to all the semiconductor devices having a structure in which a contact has to be formed by preventing a short circuit to another contact in a lower layer.

It is apparent that the present invention is not limited to the above embodiments, but may be modified and changed without departing from the scope and spirit of the invention.

What is claimed is:

1. A method of manufacturing a semiconductor device that comprises at least a first contact and a second contact having a larger height than the first contact that share at least one interlayer insulating film and are disposed close to each other, comprising:
    etching back the upper surface of the first contact to form a recess in an interlayer insulating film in which the first contact is formed; and
    forming a silicon nitride film in the recess and etching back the silicon nitride film to form a sidewall that extends from the upper surface of the first contact and along the side surface of the recess,
    wherein the silicon nitride film extends below an upper surface of the first contact.

2. The method of manufacturing a semiconductor device according to claim 1, wherein the semiconductor device comprises a memory cell transistor and a capacitor, the capacitor is disposed in a layer above a bit line, the first contact is a bit contact connected to the bit line, and the second contact is a capacitor contact connected to the capacitor.

3. The method of manufacturing a semiconductor device according to claim 1, wherein a plug buried as the first contact has a structure of at least two layers comprising a barrier film and a plug metal part, and the recess is shaped to be at the same level as or deeper than the upper surface of the plug metal part at a part thereof lying on the barrier film.

4. The method of manufacturing a semiconductor device according to claim 1, wherein the depth of the recess to the upper surface of the first contact is 30 to 60 nm.

5. The method of manufacturing a semiconductor device according to claim 1, wherein the dimension of the silicon nitride sidewall from the upper surface of the first contact to the side surface of the recess is equal to or more than 20 nm and equal to or less than a quarter of the diameter of the top of the first contact.

6. The method of manufacturing a semiconductor device according to claim 1, wherein the diameter of the top of the first contact is larger than the diameter of the bottom thereof.

7. The method of manufacturing a semiconductor device according to claim 3, wherein the part of the recess lying on the barrier film has a depth that is equal to or more than 30 nm and equal to or less than a half of the depth of a contact hole formed in the interlayer insulating film in which the first contact is formed.

8. The method of manufacturing a semiconductor device according to claim 3, wherein the barrier film is a TiN/Ti multilayer film, and the plug metal part is made of tungsten.

9. The method of manufacturing a semiconductor device according to claim 3, wherein the recess is formed by:
    depositing the barrier film and the plug metal film in a contact hole formed in the interlayer insulating film in which the first contact is formed and then perform planarization to expose the interlayer insulating film;
    selectively etching back the plug metal film; and
    selectively etching back the barrier film.

10. The method of manufacturing a semiconductor device according to claim 3, wherein the recess is formed by:
    depositing the barrier film and the plug metal film in a contact hole formed in the interlayer insulating film in which the first contact is formed;
    selectively etching back the plug metal film; and
    selectively etching back the barrier film.

11. The method of manufacturing a semiconductor device according to claim 7, wherein the barrier film is a TiN/Ti multilayer film, and the plug metal part is made of tungsten.

12. A method of manufacturing a semiconductor device, comprising:
  forming an interlayer insulating film;
  forming a first contact hole penetrating the interlayer insulating film;
  forming a barrier film on a bottom surface and an inner side surface of the first contact hole;
  forming a metal plug inside the contact hole, the metal film being disposed on the barrier film in the contact hole;
  removing an upper part of the metal plug in the contact hole;
  removing an upper part of the barrier film in the contact hole; and
  forming a sidewall of a silicon nitride film at an upper part of the contact hole,
  wherein the sidewall is disposed along an opening of the contact hole, the sidewall being in contact with the metal plug and the barrier film in the contact hole,
  wherein an upper surface of the metal plug in the contact hole is formed at a higher level than an upper surface of the barrier film in the contact hole after removing the upper part of the metal plug and the upper part of the barrier film.

13. The method according to claim 12, wherein a depth of the upper surface of the metal plug from an upper surface of the interlayer insulating film is 30 to 60 nm.

14. The method according to claim 12, wherein a depth of the upper surface of the barrier film from an upper surface of the interlayer insulating film is equal to or more than 30 nm and equal to or less than half of a depth of the first contact hole.

15. A method of manufacturing a semiconductor device, comprising:
  forming an interlayer insulating film;
  forming a first contact hole penetrating the interlayer insulating film;
  forming a barrier film on a bottom surface and an inner side surface of the first contact hole;
  forming a metal plug inside the contact hole, the metal film being disposed on the barrier film in the contact hole;
  removing an upper part of the metal plug in the contact hole;
  removing an upper part of the barrier film in the contact hole;
  forming a sidewall of a silicon nitride film at an upper part of the contact hole; and
  forming a second contact hole penetrating the interlayer insulating film after forming the sidewall of the silicon nitride film, wherein a part of the sidewall is exposed in the second contact hole, and both the barrier film and the metal plug are not exposed in the second contact hole,
  wherein the sidewall is disposed along an opening of the contact hole, the sidewall being in contact with the metal plug and the barrier film in the contact hole.

16. The method according to claim 15, wherein the second contact hole is formed by etching the interlayer insulating film under condition of having a high etching selectivity of the silicon nitride film to a silicon oxide film.

* * * * *